(12) United States Patent
Smith

(10) Patent No.: US 7,872,527 B2
(45) Date of Patent: Jan. 18, 2011

(54) POWER SUPPLY CONTROL SYSTEM AND METHOD WITH VARIABLE POST-REGULATION

(75) Inventor: Graham Paul Smith, Reading (GB)

(73) Assignee: QUALCOMM, Incorporated, San Diego, CA (US)

( * ) Notice: Subject to any disclaimer, the term of this patent is extended or adjusted under 35 U.S.C. 154(b) by 3 days.

(21) Appl. No.: 12/415,632

(22) Filed: Mar. 31, 2009

(65) Prior Publication Data

US 2010/0244951 A1 Sep. 30, 2010

(51) Int. Cl.
*H03G 3/00* (2006.01)
(52) U.S. Cl. ...................... 330/127; 330/297
(58) Field of Classification Search .................. 330/127, 330/297, 296, 285
See application file for complete search history.

(56) References Cited

U.S. PATENT DOCUMENTS

| | | | | |
|---|---|---|---|---|
| 5,635,872 A | * | 6/1997 | Zimmerman | ................ 330/128 |
| 5,900,720 A | * | 5/1999 | Kallman et al. | ............. 320/167 |
| 6,031,362 A | | 2/2000 | Bradley | |
| 6,646,511 B2 | * | 11/2003 | Canyon et al. | ............... 330/297 |
| 7,183,856 B2 | * | 2/2007 | Miki et al. | ................... 330/297 |
| 7,583,149 B2 | * | 9/2009 | Funaki et al. | ............... 330/297 |
| 2002/0171481 A1 | | 11/2002 | Sasho et al. | |
| 2007/0123303 A1 | | 5/2007 | Book et al. | |

OTHER PUBLICATIONS

International Search Report and Written Opinion - PCT/US2010/029518, International Search Authority - European Patent Office - Jul. 8, 2010.

* cited by examiner

*Primary Examiner*—Henry K Choe
(74) *Attorney, Agent, or Firm*—William M. Hooks

(57) ABSTRACT

A circuit, system and method determine the control voltage for a DC-DC converter. A control module determines a raw battery voltage and an operating temperature. It references a look up table to determine a voltage regulator control voltage based on the battery voltage and the operating temperature during normal operation. In some cases, the control module also uses a level of interference to determine the control voltage.

22 Claims, 4 Drawing Sheets

POWER SUPPLY CONTROL SYSTEM AND METHOD WITH VARIABLE POST-REGULATION

BACKGROUND OF THE INVENTION

1. Field

The present invention relates generally to power supply systems, and more specifically to DC power supply management.

2. Background

Most battery powered devices use power supply management to convert the raw battery output voltage to a cleaner, more consistent power source for the active components in the device. Power supply management is often implemented using DC-to-DC converters, so called because they both are supplied with and produce direct current voltage.

One commonly used DC-to-DC converter is the linear regulator. Linear regulators include a transistor that operates in the linear region. Linear regulators produce a very clean output voltage. However, linear regulators maintain the desired output voltage by dissipating excess power as heat. Thus, they are both inefficient and challenging to integrate into a small package in which heat management is difficult.

Another commonly used DC-to-DC converter is the switched-mode power supply (SMPS). A SMPS incorporates a switching regulator which rapidly switches a power transistor between saturation (full on) and cutoff (completely off) with a variable duty cycle. The resulting rectangular waveform is low pass filtered in order to produce a nearly constant output voltage proportional to the average value of the duty cycle. One advantage of SMPS is that they have greater efficiency than linear regulators because the switching transistor dissipates little power as heat in either the saturated state and the cutoff state. However, even after significant filtering, SMPS generate an output voltage which includes a high amplitude, high frequency component called voltage ripple. Another advantage of a SMPS is that it can step up the voltage, meaning that the SMPS can provide an output voltage that is higher than the voltage level of the input voltage. For example, a battery at the input to a SMPS may provide approximately 3 volts while the SMPS provides 5 volt output.

In wireless devices which produce high frequency output signals, the ripple voltage can modulate the radio frequency (RF) output signal which induces undesirable sideband spurs. If sufficiently large, the sideband spurs both decrease the performance of the wireless system and cause the wireless device to violate emission restrictions set by governing bodies, such as the United States Federal Communications Commission (USFCC.)

BRIEF SUMMARY OF THE INVENTION

Described herein is a user equipment device that receives a battery input voltage that changes value over time. The device also has a switching regulator coupled to the battery that has a regulator control voltage input. The switching regulator is configured to receive the input voltage and to produce an output voltage dependent on a first signal applied to the regulator control voltage input. The device also has a linear regulator, such as, for example, a low drop out regulator coupled to the switching regulator and configured to receive the output voltage and produce a time-varying operating voltage. The device also has a power amplifier coupled to the low drop out regulator and configured to produce a RF output signal having an RF output power controlled by the time-varying operating voltage. The device also has a temperature sensor, such as, for example, a thermistor, configured to determine an indication of an operating temperature. The device also has an analog to digital converter coupled to the battery and configured to determine a digital representation of the input voltage. The device also has a look up table storing a set of adjustment values according to the input voltage and the operating temperature. The device also has a control module configured to receive the digital representation of the input voltage and the indication of the operating temperature. The control module determines the first signal based on the input voltage, the operating temperature and a set of adjustment values stored in the look up table.

In some embodiments, the look up table is a multi-dimensional array while in others it has one or more single entry arrays. For example, a first single entry array may be indexed according to a set of ranges of the operating temperature. A second single entry array may be indexed according to a set of ranges of the input voltage.

Also described herein is a method of power supply management. According to the method, a control module determines a battery voltage and an operating temperature. It references a look up table to determine a voltage regulator control setting based on the battery voltage and the operating temperature during normal operation. It provides the voltage regulator control setting to a non-linear power supply. The voltage regulator control setting adjusts an output voltage of the non-linear power supply. The control module provides the output voltage to a variable post regulator. In some cases the method is executed with a set of means for performing the functions just described. In some case, a computer readable medium may comprise computer readable instructions that when executed in a wireless communication device cause the device to perform the functions just described.

In some embodiment, the control module may receive an indication of an updated desired RF output power and may reference the look up table to determine an updated voltage regulator control setting based upon the updated desired RF output power. The control module or another component in the device may adjust an output of the variable post regulator based on the desired RF output power of a power amplifier. A power detector may be used for measuring the size of an unwanted intermodulation product and the control module may determine a second updated voltage regulator control setting based upon the size of unwanted intermodulation products. A component in the device may measure a power level of received interference and determine a second updated voltage regulator control setting based upon the power level. A state of a second circuit may also be monitored and a second updated voltage regulator control setting may be determined based upon the state. In some cases the method is executed with a set of means for performing the functions just described. In some case, a computer readable medium may comprise computer readable instructions that when executed in a wireless communication device cause the device to perform the functions just described.

DETAILED DESCRIPTION OF THE INVENTION

Figure 1:
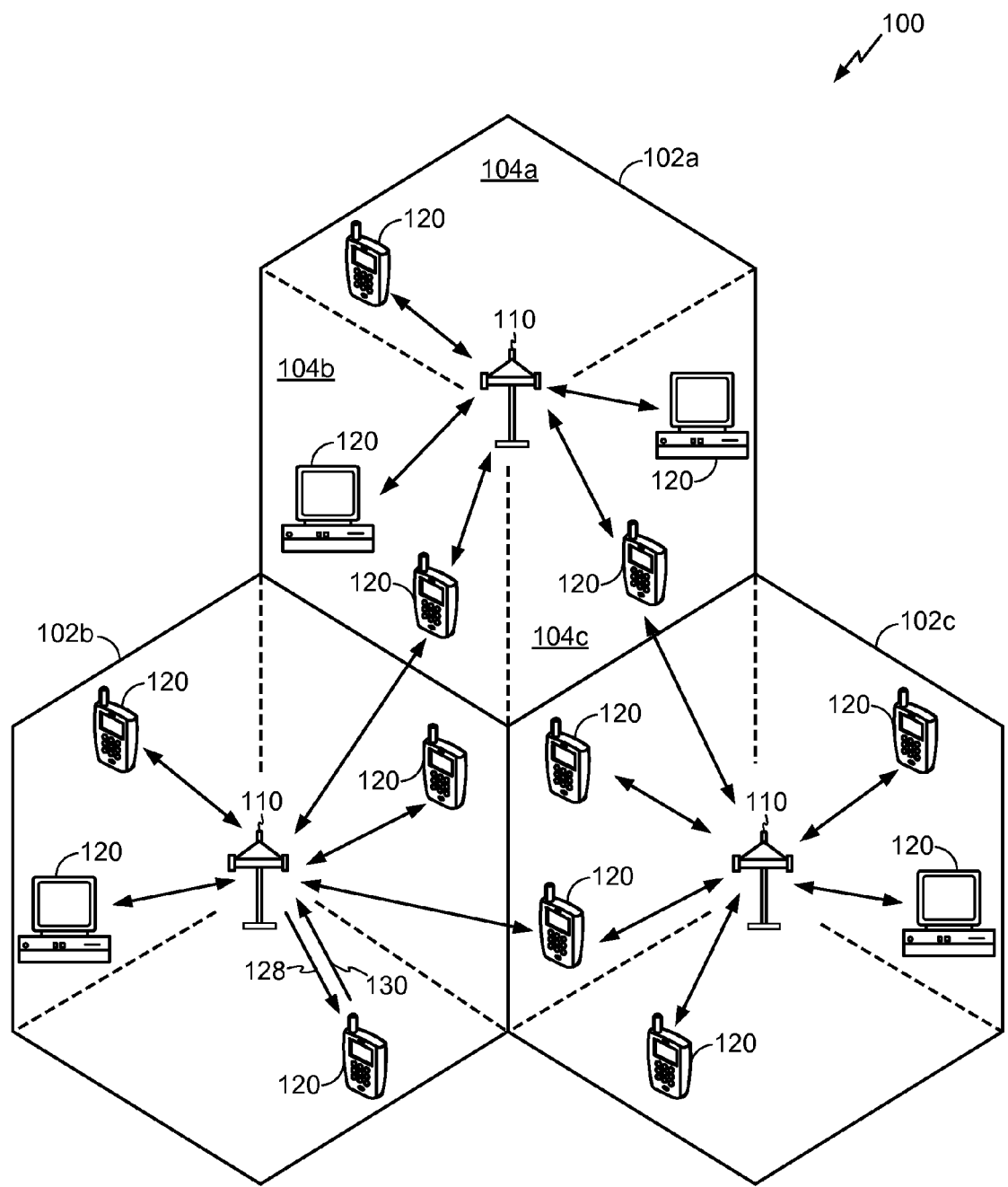
FIG. 1 illustrates a wireless communication system with multiple base stations and multiple user equipment devices.

FIG. 1 illustrates a wireless communication system 100 with multiple base stations 110 and multiple user equipment devices (UE) 120. A base station is generally a fixed-location station that communicates with the UEs within its coverage area, such as coverage areas 102a, 102b, and 102c. To improve system capacity, a base station coverage area may be partitioned into multiple smaller areas such as shown in FIG. 1 as the sectors 104a, 104b, and 104c of the coverage area 102a.

A base station is sometimes referred to as a base station transceiver subsystem (BTS) or access point and in general can be any wireless network entry point. Likewise, a UE may be fixed, nomadic or mobile. An UE is sometimes referred to as a subscriber system, subscriber unit, mobile station, mobile, remote station, remote terminal, access terminal, user terminal, user agent, user device or customer premise equipment. User equipment can take the form of a cellular telephone, cordless telephone, Session Initiation Protocol (SIP) phone, wireless local loop (WLL) station, personal digital assistant (PDA), handheld device, gaming terminal, wireless modem card or dongle, or other processing device used to connect with a wireless communication system. The UE 120 can establish a bidirectional communication link with the base station 110 over a downlink 128 (or forward link) from the base station 110 to the UE 120, and an uplink 130 (or reverse link) from the UE 120 to the base stations 110.

As shown in FIG. 1, the UEs 120 typically have components for user input, such as a microphone, touch screen, key pad and the like. They typically also have user output components such as a display, speaker and the like.

Figure 2:
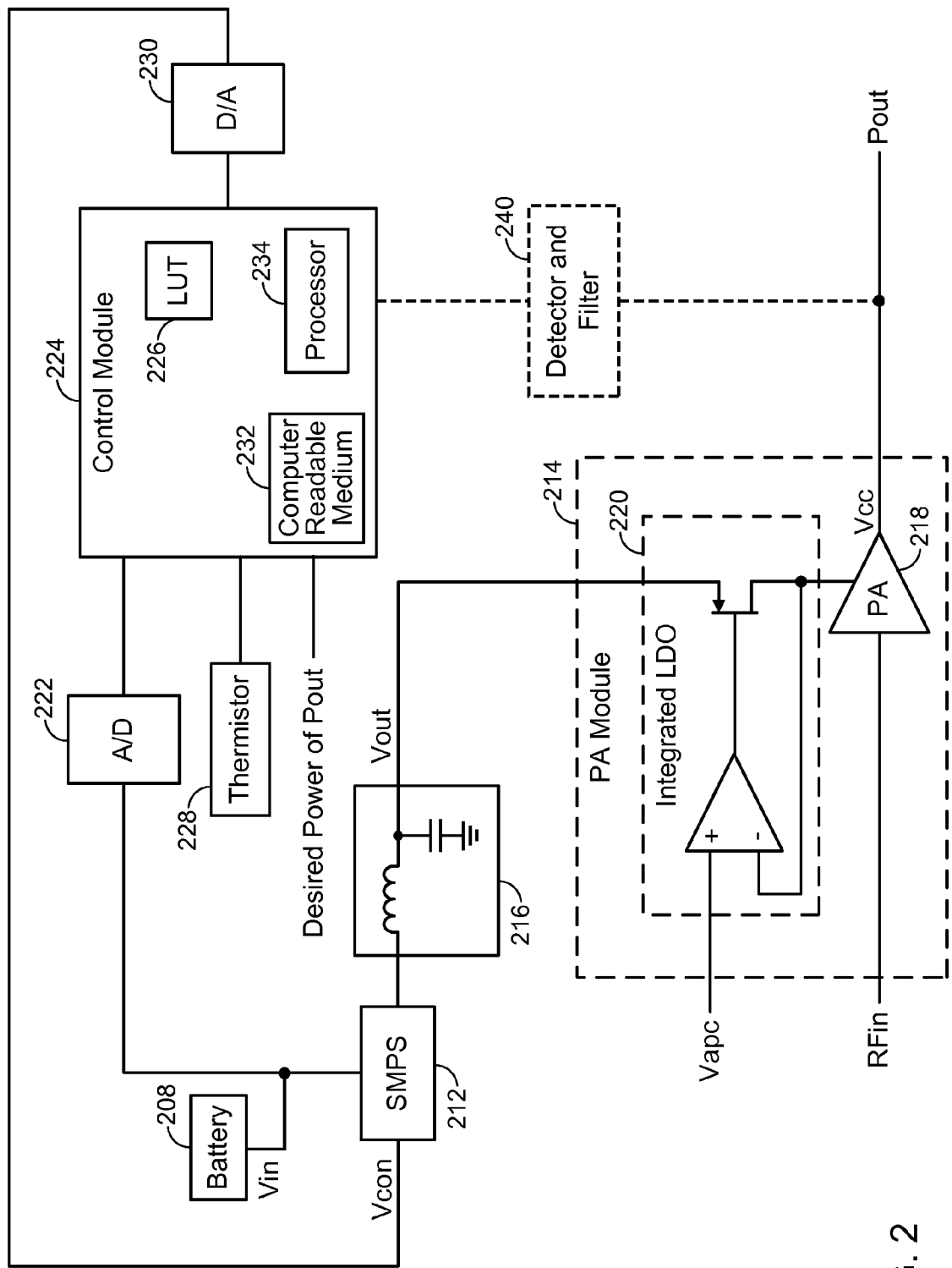
FIG. 2 is a simplified block diagram showing a portion of an user equipment device including a switched mode power supply (SMPS) driving a power amplification module.

FIG. 2 is a simplified block diagram showing an user equipment device 200 including a switched mode power supply (SMPS) driving a power amplification module. Such a circuit is often used in the transmit portion of a wireless user equipment device, such as, for example, the ones shown in FIG. 1. In the examples and descriptions below, we describe a system embodied in a wireless user equipment device that is powered by a battery. However, the system has applicability in many devices in which efficient DC operation and reduced voltage ripple is beneficial.

In FIG. 2, a SMPS 212 provides DC-to-DC conversion. The SMPS 212 receives raw battery input voltage Vin from a battery 208 and produces a converted voltage output, the value of which is controlled by a control voltage Vcon. For example, the SMPS 212 may incorporate a switching regulator which rapidly switches a power transistor between saturation (full on) and cutoff (completely off) with a variable duty cycle. The resulting rectangular waveform is low pass filtered in order to produce a nearly constant output voltage proportional to the average value of the duty cycle. The converted voltage output is low pass filtered by a low pass filter 216. The output of the low pass filter 216 is a SMPS output voltage Vout.

Due to the switched nature of the SMPS 212, the SMPS output voltage Vout includes an undesirable ripple voltage, typically most predominate at the switching frequency at which the SMPS 212 operates. Although the low pass filter 216 provides some smoothing of the voltage ripple, it does not eliminate it completely. The amount of voltage ripple at the output of the SMPS 212 can be reduced through the use of additional filtering. However, such additional filtering comes at the expense of a larger physical size as well as the need for higher quality, more costly components and a more complex design. Moreover, the additional filtering degrades the transient performance (e.g. the time lag between when power is applied to Vin until the SMPS output voltage Vout has reached an usable value), which in turn increases the average power consumption of the device.

The SMPS output voltage Vout is coupled to a power amplifier module 214. The power amplifier module 214 includes an integrated linear, low drop out voltage regulator (LDO) 220 as well as a power amplifier (PA) 218. The LDO 220 receives the SMPS output voltage Vout and produces a time-varying operating voltage Vcc which is applied to a power amplifier 218. In one aspect, the SMPS 212 drives one or more additional linear or non-linear regulators.

A LDO is a specific type of linear regulator. A linear regulator's dropout voltage determines the lowest input voltage which can be used to output the desired voltage value. If, for example, the LDO has a dropout voltage around 700 millivolts, a 3.3 volts output voltage necessitates an input voltage of at least 4 volts. Any device having a drop-out voltage of less than about 1 volt may be considered a LDO.

The power amplifier 218 receives a low power RF signal RFin and produces a corresponding high power RF output signal Pout. The RF output signal Pout is typically coupled to an antenna (not shown), perhaps through one or more passive elements. The LDO 220 provides yet further isolation between the ripple voltage and the power amplifier 218. However, even with the additional isolation, some of the ripple voltage passes through the LDO 220 and is present on the operating voltage Vcc.

An analog power control voltage Vapc controls the voltage level of the operating voltage Vcc. In turn, variations in the operating voltage Vcc adjust the power of the RF output signal Pout. Because of the use of an SMPS in series with a LDO regulator, the LDO 220 is referred to as a post regulator. Because the operating voltage Vcc varies during normal operation, the LDO 220 is said to provide variable post-regulation.

In many wireless environments, the power transmitted over the an uplink 130 increases as the UE 120 moves away from the base station 110 and as the data rate on the an uplink 130 is increased. As such, when an UE is in use, the power level of the RF output signal Pout changes over time.

In the same way that operating voltage Vcc adjusts the power level of the RF output signal Pout, any ripple on the operating voltage Vcc also affects the power level of the RF output signal Pout. Thus, the ripple voltage on the operating voltage Vcc causes amplitude modulation (AM) of the RF output signal Pout.

In some aspects, the PA 218 may have a gain control input other than Vcc which affects the power level of the RF output signal Pout. In such an aspect, it is still advantageous to control Vcc. Typically power amplifiers are non-linear. In a non-linear amplifier, the efficiency of the amplifier is dependent upon Vcc. A higher voltage on Vcc results in lower efficiency for a given RF output power. However, increasing the voltage of Vcc also increases the linearity of the amplifier. Thus, the voltage level of Vcc impacts the purity of the output spectrum. Therefore, it is advantageous to keep Vcc at a level which provides adequate spectrum purity while not being excessively inefficient, even when an alternate power control mechanism is used to fully or partially control the RF output power.

Figure 3:
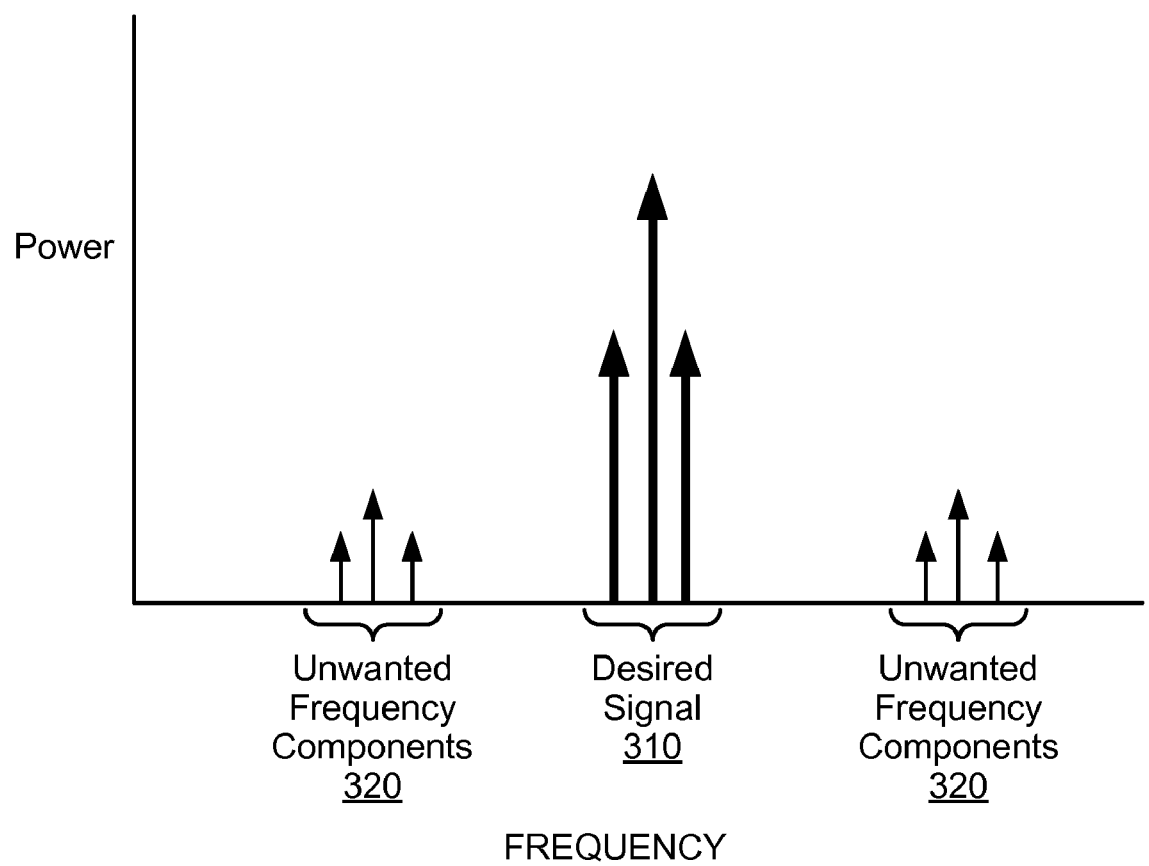
FIG. 3 shows an illustrative frequency domain depiction of the RF output signal Pout produced by the power amplifier.

FIG. 3 shows an illustrative frequency domain depiction of the RF output signal Pout produced by the power amplifier 218. In FIG. 3, the horizontal axis represents frequency and the vertical axis represents power. A desired signal 310 is centered about a carrier frequency and is an amplified version of the low power RF signal RFin. FIG. 3 also illustrates the unwanted frequency components 320 produced by the ripple voltage. Typically, the frequency components 320 are produced above and below the carrier frequency of the desired signal and are offset by the switching frequency used by the SMPS 212. In addition to degrading system performance, should they get too large, the unwanted frequency components 320 may violate governmental restrictions setting limits to emissions outside the desired frequency band.

The LDO 220 works most efficiently when the SMPS output voltage Vout is very close in value to the operating voltage Vcc. However, the isolation provided by LDO 220 decreases as the SMPS output voltage Vout approaches the operating voltage Vcc. Thus, the relative values of the SMPS output voltage Vout and the control voltage Vcon affect the amplitude of unwanted frequency components as well as the operating efficiency.

Typically, the performance of the components changes significantly across temperature. For example, the LDO 220 may provide less isolation as the temperature is increased.

Likewise, the ripple voltage on the SMPS output voltage Vout changes as the value of the raw battery voltage Vin changes. The raw battery voltage Vin can change significantly over the course of the charging cycle as well as based on load, temperature and the like. Thus, together the various voltage levels and the operating temperature significantly can affect the amplitude of the unwanted intermodulation products.

Thus, in the embodiment shown in FIG. 2, a control module 224 controls the value of the control voltage Vcon in order to provide efficient operation and an acceptable level of unwanted frequency components over a variety of operating conditions. The control module 224 determines a battery voltage. For example, an analog to digital (A/D) converter 222 samples the value of the raw battery voltage Vin and provides a digital representation to the control module 224. As discussed more fully below, the control module 224 determines an operating temperature. For example, a thermistor 228, or other temperature sensing device, provides an indication of an operating temperature to the control module 224. The control module 224 references a look up table to determine a value of the control voltage Vcon appropriate for the current operating conditions. Typically, the control module 224 produces a digital representation of the control voltage which is converted to an analog form by a digital to analog converter (D/A) 230. The D/A 230 may be integrated into either the control module 224 or the SMPS 212 or it may be a stand alone element. The D/A 230 may take the form of a traditional multi-bit D/A converter, pulse width modulation filter or the like. In one embodiment, a computer readable medium 232 stores code executable by a processor 234 that when executed provides the functions of the control module 224.

In one aspect, the LUT 226 is a multi-dimensional array indexed by a desired RF output power. (Because the value of the control voltage Vcon changes as a function of the desired RF output power, indexing the array according to the desired RF output power is often equivalent to indexing according to a nominal control voltage Vcon.) The multi-dimensional array stores a set of adjustment values for a nominal control voltage Vcon according to the desired power of the RF output signal, the battery voltage and the operating temperature.

In another embodiment, the stored offset adjustment values are independent of output power and the adjustment values are stored a single entry array indexed according to a range of temperature values or raw battery voltages or other parameter.

The single entry array format has the advantage that it requires less memory than a full multi-dimensional array. A single entry array is also some times referred to as a single dimension array. A single entry array typically has a format as follows: {single array[X]}. In contrast, a two dimensional array typically has a format as follows: {multi array[X][Y]}.

In one aspect, the control module 224 determines the value of the control voltage Vcon every so often and whenever the desired power of the RF output signal Pout changes. The LUT 226 is typically implemented in non-volatile memory. The stored values may be determined during a device-specific calibration process, such as implemented during factory test, or may be uniform across a large set of devices.

In one aspect, a power detector and filter 240 are used to measure the size (e.g. amplitude or power) of the unwanted frequency components in the RF output signal Pout. The measured value is coupled to the control module 224. If the control module 224 determines that the size is too high, it can increase the value of the SMPS output voltage Vout. If the size is quite low, the control module 224 can decrease the value of SMPS output voltage Vout, in order to operate more efficiently. As such, the size of the unwanted frequency components can be controlled a closed loop fashion.

Figure 4:
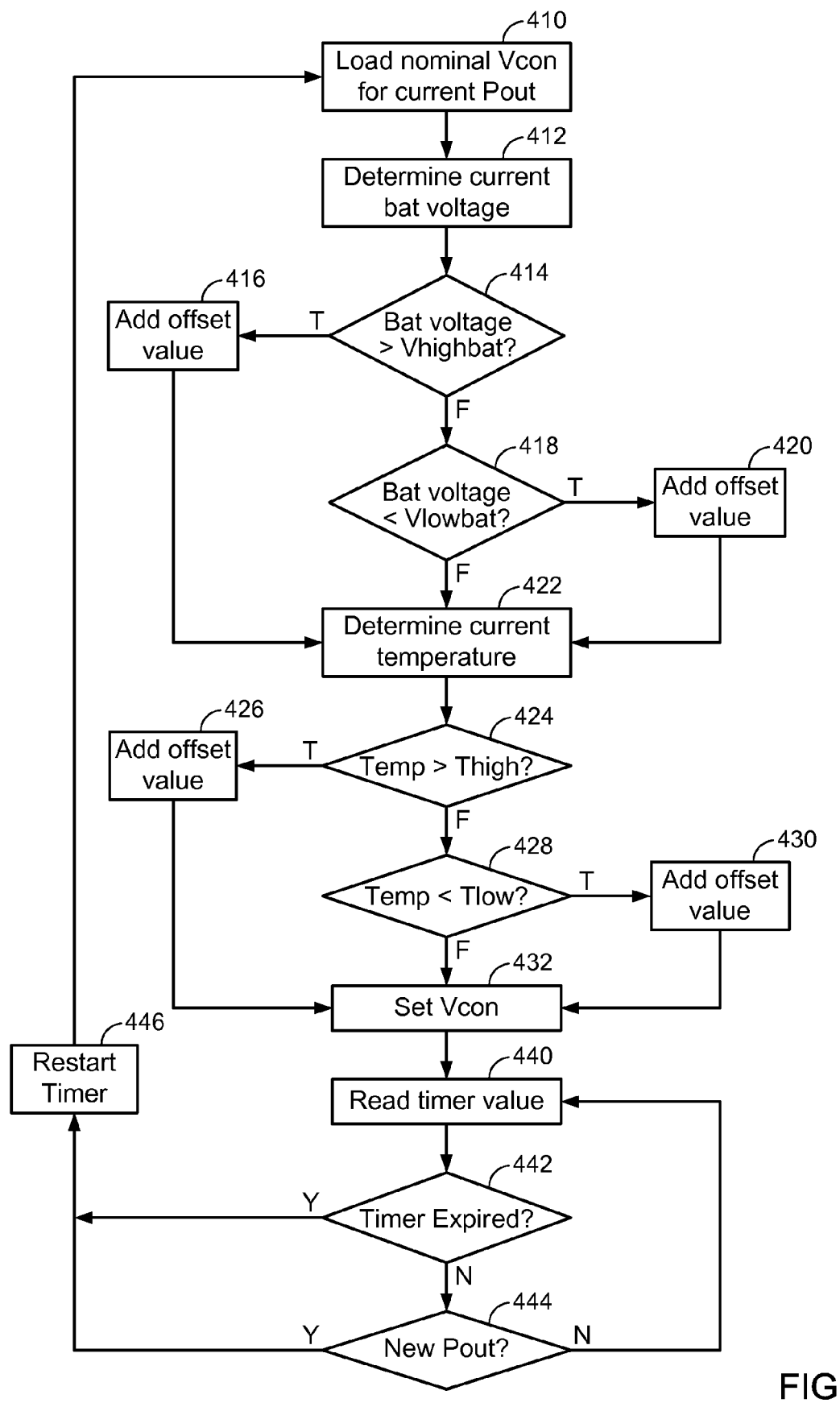
FIG. 4 is an exemplary flow chart illustrating the use of a regulator control voltage to facilitate efficient operation over a range of temperature, RF output powers, battery voltages and the like while maintaining the output spectral purity at an acceptable level.

FIG. 4 is an exemplary flow chart illustrating the use of a regulator control voltage to facilitate efficient operation in a variable post-regulation system over a range of temperatures, RF output powers, battery voltages and the like while maintaining the output spectral purity at an acceptable level. In block 410, the nominal value for the control voltage Vcon is determined for the current desired power of the RF output signal Pout. For example, the control module 224 receives an indication of the desired output power, presumably from an user equipment control module (not shown in FIG. 2) and determines the nominal (uncompensated) value of Vcon as stored in the LUT 226.

In block 412, the current raw battery voltage is determined. For example, the A/D 222 converts the raw battery voltage Vin to a digital representation of the battery voltage and provides this value to the control module 224.

In block 414, the control module 224 determines whether the current battery voltage exceeds a threshold (Vhighbat) over which the value of the control voltage Vcon should be adjusted. If so, in block 416, the control module 224 references the LUT 226 to determine a battery adjustment offset by which the value of control voltage Vcon should be adjusted. The value is used to adjust the value of Vcon. In one embodiment, the adjustment values are stored in a simple one-dimensional array in which each index value corresponds to a finite range of battery voltages. The control module 224 determines which index corresponds to the current battery voltages, extracts the corresponding value from the array and adds it to the nominal value.

In another embodiment, value of the battery adjustment offset is a function of one or more of the desired RF output signal (or the nominal value of Vcon) and the temperature and other factors. In yet another embodiment, value of the battery adjustment offset is a function of other factors aside from RF output power, temperature and battery voltage. For example, the receiver in the user equipment device may be sensitive to the unwanted frequency components produced by the PA. Thus, the control module 224 may increase intermodulation suppression by increasing the value of the SMPS output voltage Vout when the receive section is operating simultaneously with the PA module 214 or when the receive section is receiving a very small signal. Flow continues to block 422.

If in block 414 the current battery voltage does not exceed Vhighbat, flow continues to block 418. In block 418, the control module 224 determines whether the current battery voltage falls below a threshold (Vlowbat) under which the value of the control voltage Vcon should be adjusted. If so, in block 420, the control module 224 references the LUT 226 to determine a battery adjustment offset by which the value of control voltage Vcon should be adjusted and Vcon is adjusted according. Typically the same array format is used for both the Vhighbat and Vlowbat compensation arrays. If in block 418 the current battery voltage does not fall below Vlowbat, flow continues to block 422. In one embodiment, the decision blocks 414 and 418 are collapsed into a single decision block and the adjustment blocks 416 and 420 are collapsed into a single look-up and adjust operation.

In block 422, the temperature is determined by a local temperature sensing device. For example, the thermistor 228, or other temperature sensing device, determines an indication of an operating temperature and provides it in a digital format to the control module 224. Typically the local temperature sensing device characterizes the temperature of the printed wired board (PWB) supporting the PA module.

In block 424, the control module 224 determines whether the current temperature exceeds a threshold (Thigh) over which the value of the control voltage Vcon should be adjusted. If so, in block 426, the control module 224 references the LUT 226 to determine a temperature adjustment offset by which the value of control voltage Vcon should be adjusted. The value is used to adjust the value of Vcon. In one embodiment, the value of the temperature adjustment offset is a function of one or more of the desired RF output signal, the raw battery voltage and other factors. In a similar manner as discussed above, the array may be one dimensional or multi-dimensional. Flow continues to block 432.

If in block 424 the current temperature does not exceed Thigh, flow continues to block 428. In block 428, the control module 224 determines whether the current temperature falls below a threshold (Tlow) under which the value of the control voltage Vcon should be adjusted. If so, in block 430, the control module 224 references the LUT 226 to determine a temperature adjustment offset by which the value of control voltage Vcon should be adjusted. The value is used to adjust the value of Vcon. Typically the same array format is used for both the Thigh and Tlow compensation arrays. If in block 428 the current temperature does not fall below Tlow, flow continues to block 432. In one embodiment, the decision blocks 424 and 428 are collapsed into a single decision block and the adjustment blocks 426 and 430 are collapsed into a single look-up and adjust operation.

In block 432, during the normal operation of the user equipment device in the field the control voltage Vcon is set to the newly-determined, adjusted Vcon value. If the newly-determined, adjusted Vcon is different from the previous value, the value of Vout changes. The new value of Vout is applied to the PA module. As noted above, the value of Vout, in conjunction with other factors, acts upon the efficiency of operation as well as the amplitude of the unwanted inter-modulation products.

In block 440, a timer value is read. As noted above, both the raw battery voltage Vin and the temperature change over time. In particular, the temperature may change quite rapidly if the RF output signal Pout remains at a high value for an extended period of time. Therefore, the process just described must be repeated over time. In the embodiment shown in FIG. 4, a timer is used to set a maximum time lapse between updates made to the control voltage Vcon. In block 442, the control module 224 determines whether the timer has expired. If so, flow continues to block 446 in which the timer is reset and then on to block 410, in which the flow starts again.

As note above, the value of the SMPS output voltage Vout relative to the analog power control voltage Vapc influences the amplitude of the unwanted intermodulation products. Thus, when the desired power of the RF output signal Pout changes leading to a corresponding change in Vapc, the SMPS output voltage Vout also typically changes. Thus, in block 444, the control module 224 determines whether a new desired output power has been received. If so, the timer is reset in block 446 and flow continues back to block 410. If not, flow continues back to block 440.

Although described with reference to FIGS. 2, 3 and 4 in the context of a transmit chain including a power amplifier, the principles described herein can be applied in a similar manner to any device in which a noisy voltage regulator is used in conjunction with a linear regulator to provide variable post regulation in order to reduce system noise. For example, the suppression of unwanted frequency components is important in the receive chain also. Thus, similar techniques can be used to set the proper control voltage Vcon in a receive chain. For example, the presence of one or more large interference signals at the receiver can cause the affects of unwanted frequency components to increase within the receive chain. Increasing the operating voltage of the receive chain as well as the voltage drop across the LDO can lessen these effects. Thus, a similar configuration may be used to adjust the operating voltage of the receive chain in the presence of interference. In addition, the value of Vout may be a function of the state of more than one circuit to which a regulator is providing power. The value of Vout may be a function of a state of a circuit which receives power from another source. In addition to the states disclosed above, the state may be an on/off state of a circuit as well as a receive signal level, a gain at which a circuit is operating and the like. In some embodiments, a receiver or other circuitry may be coupled to a common noisy voltage regulator, a common linear regulator or both. In other embodiment, the receiver or other circuitry may be coupled to an alternative noisy regulator, linear regulator or both.

As used herein, the term coupled or connected is used to mean an indirect coupling as well as a direct coupling or connection. Where two or more blocks, modules, devices, or apparatus are coupled, there may be one or more intervening blocks between the two coupled blocks.

The various illustrative logical blocks, modules, and circuits described in connection with the embodiments disclosed herein may be implemented or performed with a general purpose processor, a digital signal processor (DSP), a Reduced Instruction Set Computer (RISC) processor, an application specific integrated circuit (ASIC), a field programmable gate array (FPGA) or other programmable logic device, discrete gate or transistor logic, discrete hardware components, or any combination thereof. A general purpose processor may be a microprocessor, but in the alternative, the processor may be any processor, controller, microcontroller, or state machine. A processor may also be implemented as a combination of computing devices, for example, a combination of a DSP and a microprocessor, a plurality of microprocessors, one or more microprocessors in conjunction with a DSP core, or any other such configuration.

The steps of a method, process, or algorithm described in connection with the embodiments disclosed herein may be embodied directly in hardware, in a software module executed by a processor, or in a combination of the two. The various steps or acts in a method or process may be performed in the order shown, or may be performed in another order. Additionally, one or more process or method steps may be omitted or one or more process or method steps may be added to the methods and processes. An additional step, block, or action may be added in the beginning, end, or intervening existing elements of the methods and processes.

The above description of the disclosed embodiments is provided to enable any person of ordinary skill in the art to make or use the disclosure. Various modifications to these embodiments will be readily apparent to those of ordinary skill in the art, and the generic principles defined herein may be applied to other embodiments without departing from the spirit or scope of the disclosure. Thus, the disclosure is not intended to be limited to the embodiments shown herein but is to be accorded the widest scope consistent with the principles and novel features disclosed herein.

What is claimed is:

1. User equipment comprising:
   a switching regulator having a regulator control voltage input, wherein the switching regulator is configured to receive an input voltage and to produce an output voltage dependent on a first signal applied to the regulator control voltage input;
   a linear regulator coupled to the switching regulator and configured to receive the output voltage and produce a time-varying operating voltage;
   a power amplifier coupled to the linear regulator and configured to produce a RF output signal having an RF output power controlled the time-varying operating voltage;
   a temperature sensing device configured to determine an indication of an operating temperature;
   an analog to digital converter configured to receive the input voltage and to determine a digital representation of the input voltage;
   a look up table storing a set of adjustment values according to the input voltage and the operating temperature; and
   a control module configured to receive the digital representation of the input voltage and the indication of the operating temperature and configured to determine the first signal based on the input voltage, the operating temperature and a set of adjustment values stored in the look up table.

2. The user equipment of claim 1 further comprising a battery configured to produce the input voltage.

3. The user equipment of claim 1 wherein the look up table is a multi-dimensional array.

4. The user equipment of claim 1 wherein the look up table comprises at least two single entry arrays, a first single entry array indexed according to a set of ranges of the operating temperature and a second single entry array indexed according to a set of ranges of the input voltage.

5. A method of power supply management comprising:
   determining a battery voltage;
   determining an operating temperature;
   referencing a look up table to determine a voltage regulator control setting based on the battery voltage and the operating temperature during normal operation;
   providing the voltage regulator control setting to a non-linear power supply, wherein the voltage regulator control setting adjusts an output voltage of the non-linear power supply; and
   providing the output voltage to a variable post regulator.

6. The method of power supply management of claim 5 further comprising:
   receiving an indication of an updated desired RF output power; and
   referencing the look up table to determine an updated voltage regulator control setting based upon the updated desired RF output power.

7. The method of power supply management of claim 5 further comprising adjusting an output of the variable post regulator based on a desired RF output power of a power amplifier.

8. The method of power supply management of claim 5 further comprising:
   measuring a size of an unwanted intermodulation product; and
   determining a second updated voltage regulator control setting based upon the size.

9. The method of power supply management of claim 5 further comprising:
   measuring a power level of received interference; and
   determining a second updated voltage regulator control setting based upon the power level.

10. The method of power supply management of claim 5 further comprising:
    monitoring a state of a second circuit; and
    determining a second updated voltage regulator control setting based upon the state.

11. A device that controls the efficiency and performance of a set of electronic circuitry comprising:
    means for determining a battery voltage;
    means for determining an operating temperature;
    means for referencing a look up table to determine a voltage regulator control setting based on the battery voltage and the operating temperature during normal operation;
    means for providing the voltage regulator control setting to a non-linear power supply, wherein the voltage regulator control setting adjusts an output voltage of the non-linear power supply; and
    means for providing the output voltage to a variable post regulator.

12. The device that controls the efficiency and performance of a set of electronic circuitry of claim 11 comprising:
    means for receiving an indication of an updated desired RF output power; and
    means for referencing the look up table to determine an updated voltage regulator control setting based upon the updated desired RF output power.

13. The device that controls the efficiency and performance of a set of electronic circuitry of claim 11 comprising means for adjusting an output of the variable post regulator based on a desired RF output power of a power amplifier.

14. The device that controls the efficiency and performance of a set of electronic circuitry of claim 11 comprising:
    means for measuring a size of an unwanted intermodulation product; and
    means for determining a second updated voltage regulator control setting based upon the size.

15. The device that controls the efficiency and performance of a set of electronic circuitry of claim 11 comprising:
    measuring a power level of received interference; and
    determining a second updated voltage regulator control setting based upon the power level.

16. The device that controls the efficiency and performance of a set of electronic circuitry claim 11 further comprising:
    means for monitoring a state of a second circuit; and
    means for determining a second updated voltage regulator control setting based upon the state.

17. A computer readable medium comprising computer readable instructions that when executed in a wireless communication device cause the device to provide control of the efficiency and performance of the device, wherein upon execution the instructions cause the device to:
    determine a battery voltage;
    determine an operating temperature;

reference a look up table to determine a voltage regulator control setting based on the battery voltage and the operating temperature during normal operation;

provide the voltage regulator control setting to a non-linear power supply, wherein the voltage regulator control setting adjusts an output voltage of the non-linear power supply; and provide the output voltage to a variable post regulator.

18. The computer readable medium of claim 17, wherein execution the instructions further cause the device to:

receive an indication of an updated desired RF output power; and reference the look up table to determine an updated voltage regulator control setting based upon the updated desired RF output power.

19. The computer readable medium of claim 17, wherein execution the instructions further cause the device to adjust an output of the variable post regulator based on a desired RF output power of a power amplifier.

20. The computer readable medium of claim 17, wherein execution the instructions further cause the device to:

measure a size of an unwanted intermodulation product; and determine a second updated voltage regulator control setting based upon the size.

21. The computer readable medium of claim 17, wherein execution the instructions further cause the device to:

measure a power level of received interference; and determine a second updated voltage regulator control setting based upon the power level.

22. The computer readable medium of claim 17, wherein execution the instructions further cause the device to:

to monitor a state of a second circuit; and to determine a second updated voltage regulator control setting based upon the state.

* * * * *